(12) United States Patent
Chen et al.

(10) Patent No.: US 11,280,988 B2
(45) Date of Patent: Mar. 22, 2022

(54) STRUCTURE LIGHT MODULE USING VERTICAL CAVITY SURFACE EMITTING LASER ARRAY AND FOLDING OPTICAL ELEMENT

(71) Applicant: OmniVision Technologies, Inc., Santa Clara, CA (US)

(72) Inventors: Wei-Ping Chen, New Taipei (TW); Tsung-Wei Wan, Baoshan Township (TW); Jau-Jan Deng, Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 73 days.

(21) Appl. No.: 16/120,966

(22) Filed: Sep. 4, 2018

(65) Prior Publication Data

US 2020/0073097 A1 Mar. 5, 2020

(51) Int. Cl.
*G02B 17/02* (2006.01)
*G02B 27/42* (2006.01)
*H01S 5/42* (2006.01)
*H01S 5/00* (2006.01)
*G03B 35/00* (2021.01)

(52) U.S. Cl.
CPC ......... *G02B 17/023* (2013.01); *G02B 27/425* (2013.01); *H01S 5/423* (2013.01); *G03B 35/00* (2013.01); *H01S 5/005* (2013.01)

(58) Field of Classification Search
CPC .............. G02B 17/023; G02B 27/425; G02B 19/0047; G02B 19/0028; G02B 27/0944; G02B 17/0816; H01S 5/005; H01S 5/423; H01S 5/426; H01S 5/42; G03B 35/00; G01B 11/2513; G01S 7/4815; G01S 17/48; G01S 17/894; H04N 13/254
USPC ......................................................... 359/566
See application file for complete search history.

(56) References Cited

U.S. PATENT DOCUMENTS

| | | | |
|---|---|---|---|
| 5,699,186 A * | 12/1997 | Richard | G02B 25/007 359/568 |
| 5,850,412 A | 12/1998 | Eguchi et al. | |
| 9,157,790 B2 * | 10/2015 | Shpunt | G01S 17/42 |
| 10,146,116 B2 * | 12/2018 | Kriman | G02B 19/0028 |
| 2004/0179562 A1 | 9/2004 | Carroll et al. | |
| 2009/0185274 A1 * | 7/2009 | Shpunt | G02B 27/4266 359/558 |
| 2012/0218648 A1 | 8/2012 | Lin et al. | |
| 2015/0092802 A1 * | 4/2015 | Gronenborn | H01S 5/423 372/36 |
| 2016/0197452 A1 | 7/2016 | Mor | |
| 2016/0254638 A1 | 9/2016 | Chen et al. | |
| 2019/0265496 A1 * | 8/2019 | Uhlendorf | G02B 19/0028 |

* cited by examiner

*Primary Examiner* — Kristina M Deherrera

(57) ABSTRACT

A structure light module comprises: a VCSEL substrate comprising a VCSEL array comprising a plurality of individual VCSELs; a first spacer disposed on the VCSEL substrate; a first wafer level lens comprising a glass substrate and at least a replicated lens on a first surface of the glass substrate disposed on the first spacer; a FOE disposed on the first wafer level lens; a second spacer disposes on the FOE; a second wafer level lens comprising a glass substrate and at least a replicated lens on a first surface of the glass substrate disposed on the second spacer; a third spacer disposed on the second wafer level lens; a DOE disposed on the third spacer, where a structure light is projected from the DOE on a target surface for 3D imaging.

14 Claims, 6 Drawing Sheets

STRUCTURE LIGHT MODULE USING VERTICAL CAVITY SURFACE EMITTING LASER ARRAY AND FOLDING OPTICAL ELEMENT

FIELD OF THE INVENTION

This invention relates to a structure light module, and more specifically relates to a structure light module using vertical cavity surface emitting laser array and folding optical element.

BACKGROUND OF THE INVENTION

There are many solutions for capturing 3D images including stereo camera, time-of-flight, and structure light. In the solution using structure light, a periodical pattern is generated as structure light. The periodical pattern may comprise periodical lines such as 1D or 2D grid. It may also comprise 1D or 2D periodical pattern of dots. The structure light is projected on a target surface, and the structure light on the target surface is captured by a camera. If the target surface is flat, the captured structure light is not distorted. If the target surface is not flat, the topographical structure of the target surface will distort the projected structure light. The topographical structure of the target surface can be retrieved from the captured distorted structure light. In this manner, structure light may be used for 3D imaging.

The structure light may be IR light or visible light. An IR camera may be used for capturing the IR structure light on the target surface, and a visible camera may be used for capturing the visible structure light on the target surface.

The stereo camera solution needs a sufficient parallax, which in turn needs a relatively large base line between two cameras. The time-of-flight solution needs an advanced electronic processor to determine the time difference between the light firing time and the reflected light receiving time. The structure light solution is getting popular recently since it does not need large base line between two cameras, and it does not need advanced electronic processor.

However, a conventional structure light module is still relatively tall for some applications. The distance from the light source to the structure light generating element is relatively large. It also needs to reduce the thermal effect generated by the light source of a structure light module. Accordingly, a shorter structure light module having better thermal isolation is demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
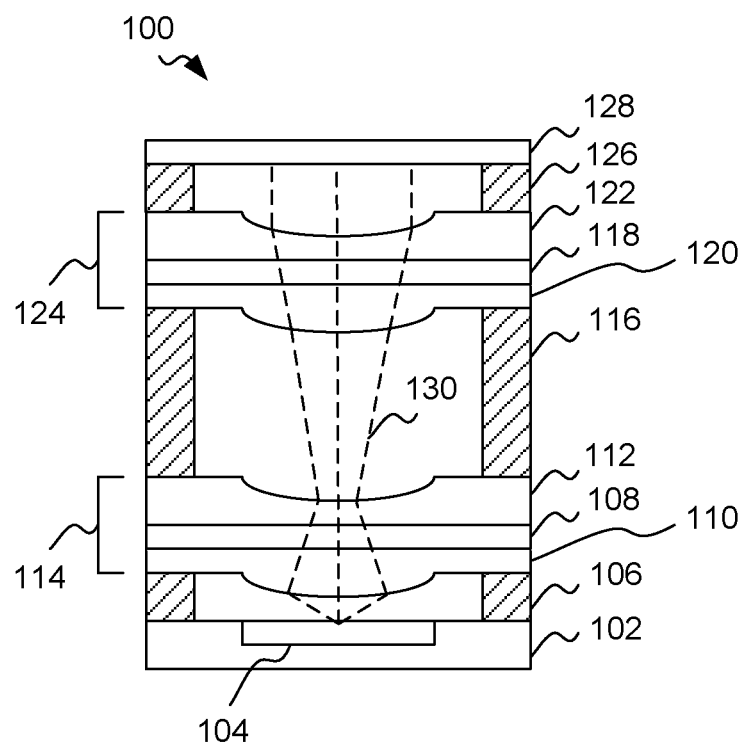
FIG. 1 schematically illustrates a structure light module, according to an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

In some implementations, conventional structure light modules may use VCSEL (vertical cavity surface emitting laser) arrays. The size of the conventional structure light module using VCSEL array may not be further reduced effectively because: (1) the module uses barrel and lens holder, (2) the single lens is thick, and (3) the lens cannot be disposed close to the VCSEL array, because the VCSEL array is hot after turning on. In the conventional structure light module, the lens module may have de-center caused by the lens barrel and holder assembly.

Some embodiments using wafer level lenses and wafer level spacers stacked on a VCSEL array are disclosed in a copending application Ser. No. 15/795,130 filed on Oct. 20, 2017, by the same inventors and assigned to the same assignee, which is incorporated herein by reference. Barrels and lens holders are not used. The wafer level lenses are thin and can be disposed close to the VCSEL array, because the lenses have been reflowed under relatively high temperature.

FIG. 1 schematically illustrates a structure light module 100, according to an embodiment of the present invention. It is appreciated that all drawings are not to scale. Structure light module 100 comprises a substrate 102, which may be a part of a semiconductor wafer comprising a VCSEL array 104. On the other hand, VCSEL array 104 may be cut from a semiconductor wafer and attached to substrate 102. To differentiate from other substrates, substrate 102 may also be referred as VCSEL substrate 102 (as in the claims). VCSEL array 104 comprises a plurality of individual VCSELs. VCSEL array 104 may emit IR light or visible light.

A first spacer 106 may be disposed directly or indirectly on substrate 102. A glass substrate 108 may have a first lens 110 replicated on a first surface of glass substrate 108 and a second lens 112 replicated on a second surface of glass substrate 108. The second surface is opposite to the first surface. Glass substrate 108 together with first replicated lens 110 and second replicated lens 112 form a first wafer level lens 114. It is appreciated that first wafer level lens 114 may comprise glass substrate 108 and only first replicated lens 110 or only second replicated lens 112. First wafer level lens 114 may be disposed directly or indirectly on first spacer 106. A second spacer 116 may be disposed directly or indirectly on first wafer level lens 114.

A glass substrate 118 may have a first lens 120 replicated on a first surface of glass substrate 118 and a second lens 122 replicated on a second surface of glass substrate 118. The second surface is opposite to the first surface. Glass substrate 118 together with first replicated lens 120 and second replicated lens 122 form a second wafer level lens 124. It is appreciated that second wafer level lens 124 may comprise glass substrate 118 and only first replicated lens 120 or only second replicated lens 122. Second wafer level lens 124 may be disposed directly or indirectly on second spacer 116. A third spacer 126 may be disposed directly or indirectly on second wafer level lens 124. A DOE (diffractive optical element) 128 may be disposed directly or indirectly on third spacer 126.

Wafer level lenses 114 and 124 may be reflowed or baked to harden first replicated lenses 110 and 120, and/or second replicated lenses 112 and 122, respectively. After reflow, wafer level lenses 114 and 124 may not deform because of high temperature. In an embodiment, first replicated lenses 110 and 120, and/or second replicated lenses 112 and 122 may be UV cured.

DOE 128 generates a far field diffraction pattern when it is illuminated by a coherent light. The coherent light may be collimated or not collimated. DOE 128 may be a grating, a phase grating, a Dammann grating, a group of grooves on a glass substrate, and the like.

When VCSEL array 104 is turned on, each individual VCSEL emits a coherent light. The emitted coherent light passes through first wafer level lens 114 and second wafer level lens 124 to illuminate DOE 128. The coherent light may be collimated or not collimated by first wafer level lens 114 and second wafer level lens 124. DOE 128 generates a far field diffraction pattern when it is illuminated with the coherent light. The generated far field diffraction pattern may be a periodical pattern that may comprise periodical lines or periodical dots. The generated far field diffraction is the structure light for 3D imaging. Accordingly, a structure light is projected from DOE 128 on a target surface for 3D imaging.

Alternatively, an imaging lens (not shown) may be used. The imaging lens images the intensity pattern generated by DOE 128 on a target surface. In other words, DOE 128 plane is the object plane and the target surface is the image plane of the imaging lens. In this situation, the far field diffraction pattern is not used for generating the structure light.

Dashed lines 130 represent light emitted by an individual VCSEL passing through first wafer level lens 114 and second wafer level lens 124 illuminating DOE 128. Dashed lines 130 may not be actual light emitted by the individual VCSEL, they are for illustration purpose only.

To reduce the thermal effect generated by VCSELs, the heat generated by VCSELs may be blocked by adding a heat insulation glass in structure light module 100. Alternatively, the length of structure light module 100 may be increased to enhance the heat dissipation in the space in structure light module 100. Either one would increase the height (i.e., the distance from VCSEL array 104 to DOE 128) of structure light module 100.

Figure 2:
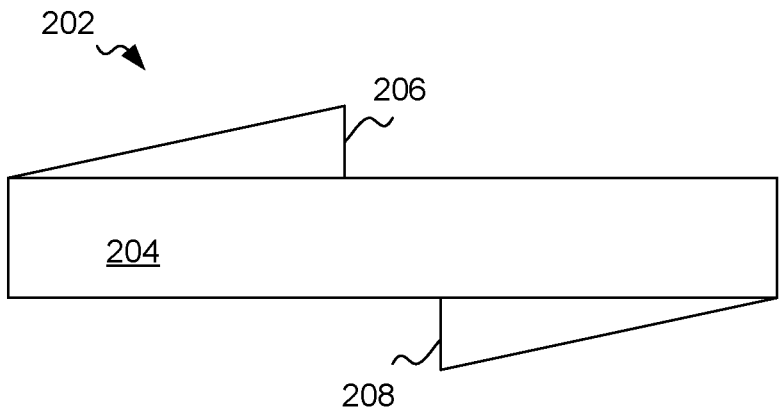
FIG. 2 schematically illustrates a wafer level FOE (folding optical element), according to an embodiment of the present invention.

FIG. 2 schematically illustrates a wafer level FOE (folding optical element) 202, according to an embodiment of the present invention. Wafer level FOE 202 comprises a glass substrate 204. A first prism 206 is replicated on a first surface of glass substrate 204 and a second prism 208 is replicated on a second surface of glass substrate 204. The second surface is opposite to the first surface. Glass substrate 204 together with first replicated prism 206 and second replicated prism 208 form a wafer level FOE 202. It is appreciated that a plurality of first prisms 206 and second prisms 208 are replicated on two sides of a glass substrate 204, respectively, in a wafer level process.

Figure 3:
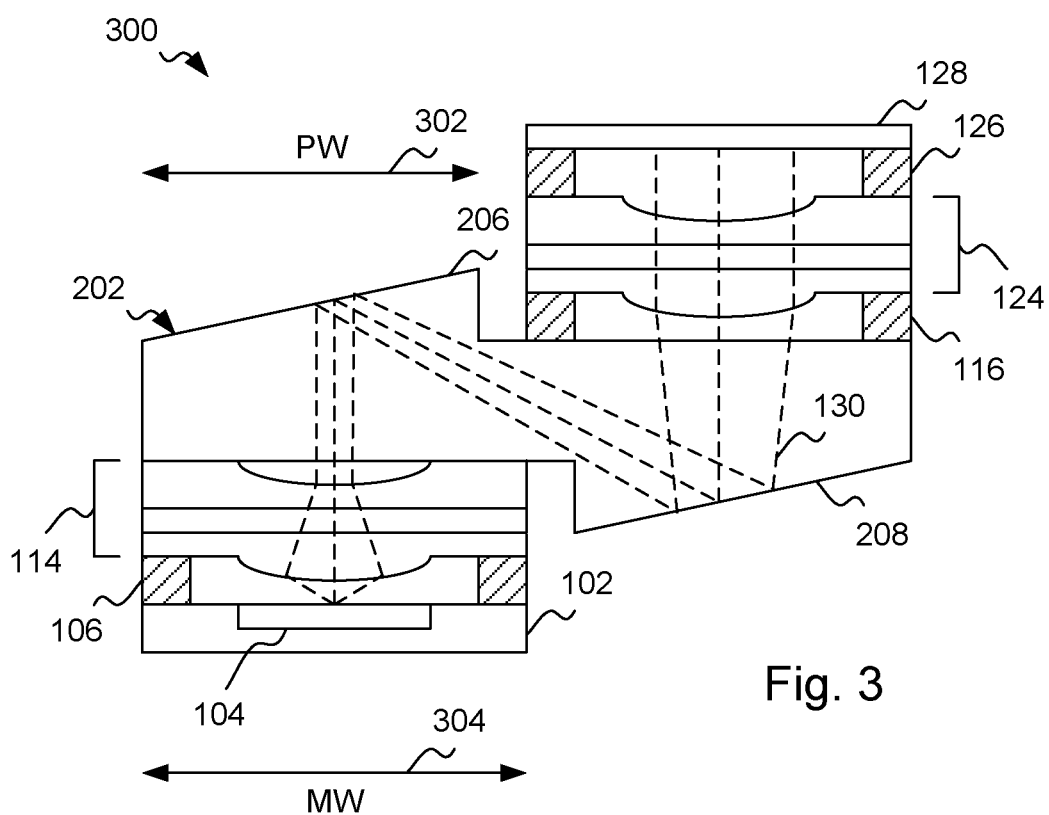
FIG. 3 schematically illustrates a structure light module, according to an embodiment of the present invention.

FIG. 3 schematically illustrates a structure light module 300, according to an embodiment of the present invention. It is appreciated that all drawings are not to scale. Similar to FIG. 1, structure light module 300 comprises substrate 102, which may be a part of a semiconductor wafer comprising VCSEL array 104. On the other hand, VCSEL array 104 may be cut from a VCSEL wafer and attached to substrate 102. VCSEL array 104 comprises a plurality of individual VCSELs. VCSEL array 104 may emit IR light or visible light.

First spacer 106 may be disposed directly or indirectly on substrate 102. First wafer level lens 114 may be disposed directly or indirectly on first spacer 106. Similar to FIG. 1, first wafer level lens 114 comprises a glass substrate having a first lens replicated on a first surface of the glass substrate and a second lens replicated on a second surface of the glass substrate. It is appreciated that the glass substrate may have only a first replicated lens or only a second replicated lens.

Wafer level FOE 202 of FIG. 2 may be disposed directly or indirectly on first wafer level lens 114. Wafer level FOE 202 has first replicated prism 206 and second replicated prisms 208 for folding light emitted from the VCSEL array 104. An input light emitted from VCSEL array 104 coming to FOE 202 is reflected by first replicated prism 206 toward second replicated prism 208. Second replicated prism 208 further reflects light reflected by first replicated prism 206 toward second wafer level lens 124.

For example, a prism width (PW) 302 of first replicated prism 206 and second replicated prism 208 is equal to or less than a module width (MW) 304 of structure light module 100. First replicated prism 206 and second replicated prism 208 reflect light based on total internal reflection. Alternatively, first replicated prism 206 and second replicated prism 208 are coated with reflecting layers, respectively.

Second spacer 116 may be disposed directly or indirectly on wafer level FOE 202. Second wafer level lens 124 may be disposed directly or indirectly on second spacer 116. Similar to FIG. 1, second wafer level lens 124 comprises a glass substrate having a first lens replicated on a first surface of the glass substrate and a second lens replicated on a second surface of the glass substrate. It is appreciated that the glass substrate may have only a first replicated lens or only a second replicated lens. Third spacer 126 may be disposed directly or indirectly on second wafer level lens 124. DOE 128 may be disposed directly or indirectly on third spacer 126.

First replicated prism 206 of FOE 202 may be aligned with first wafer level lens 114, and second replicated prism 208 of FOE 202 may be aligned with second wafer lens 124.

Wafer level lenses 114 and 124, and wafer level FOE 204 may be reflowed or baked to harden first replicated lenses, and/or second replicated lenses, and first replicated prism and second replicated prism. After reflow, wafer level lenses 114 and 124, and wafer level FOE 202 may not deform because of high temperature. In an embodiment, first replicated lenses and/or second replicated lenses, and replicated prisms, may be UV cured.

In this manner, the height (i.e., the distance from VCSEL array 104 to DOE 128) of structure light module 300 may be reduced. The thermal isolation may be improved, since structure light module 300 has two rooms (left and right) generated by wafer level FOE 202, and the heat generated by VCSEL array 104 may not propagate to the next room.

After being reflected by wafer level FOE 202 toward second wafer level lens 124, coherent light emitted from VCSEL array 104 illuminates DOE 128 in a same way as illustrated and explained in FIG. 1. Accordingly, a structure light is projected from DOE 128 on a target surface for 3D imaging.

Figure 4:
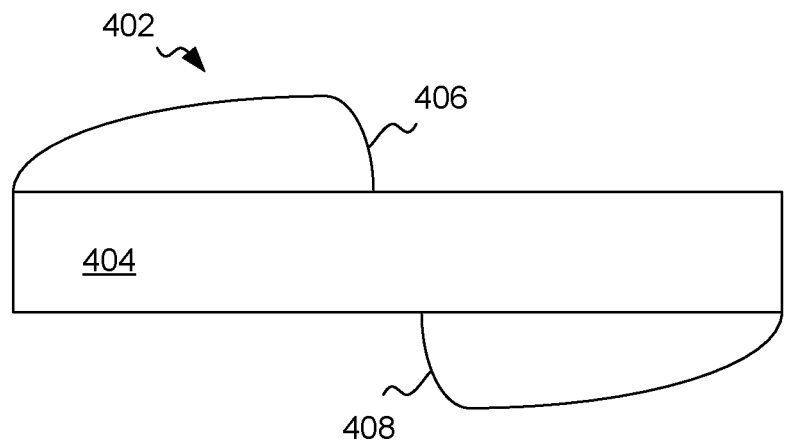
FIG. 4 schematically illustrates a wafer level FOE, according to an embodiment of the present invention.

FIG. 4 schematically illustrates a wafer level FOE 402, according to an embodiment of the present invention. Wafer level FOE 402 comprises a glass substrate 404. A first free-form-shape 406 is replicated on a first surface of glass substrate 404 and a second free-form-shape 408 is replicated on a second surface of glass substrate 404. The second surface is opposite to the first surface. Glass substrate 404 together with first replicated free-form-shape 406 and second replicated free-form-shape 408 form a wafer level FOE 402. It is appreciated that a plurality of first free-form-shape 406 and second free-form-shape 408 are replicated on two sides of a glass substrate 404, respectively, in a wafer level process.

Replicated prisms 206 and 208 of FIG. 2 and replicated free-form-shapes 406 and 408 of FIG. 4 may be referred as replicated reflecting elements (as in the claims).

Figure 5:
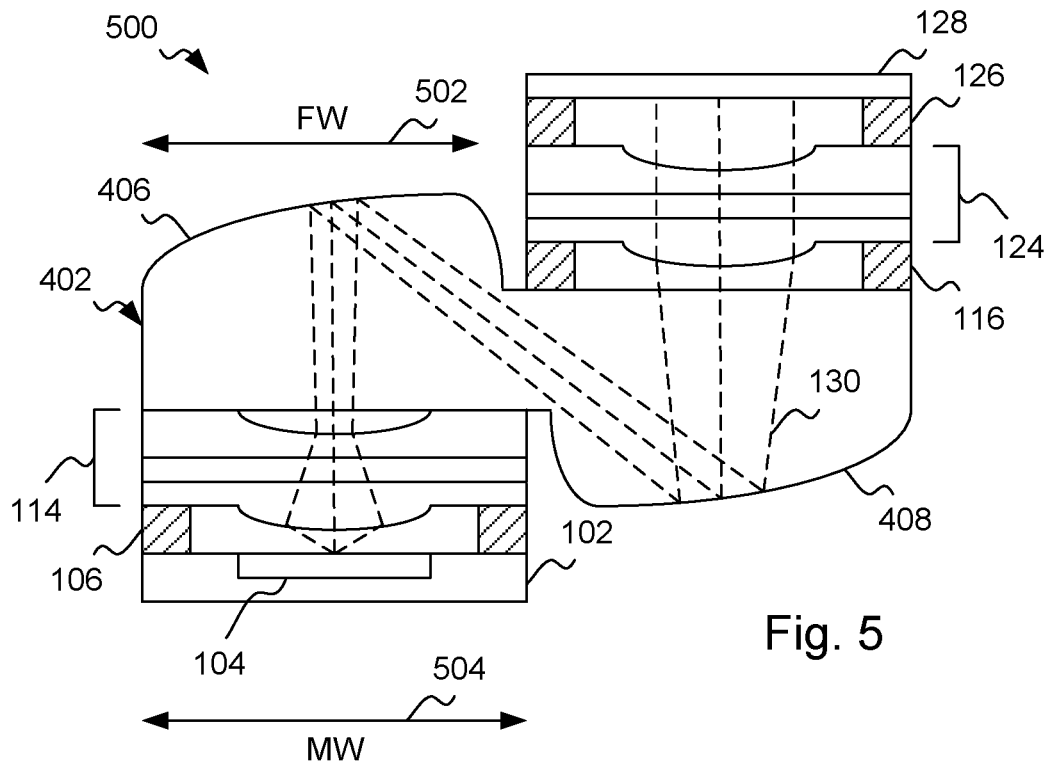
FIG. 5 schematically illustrates a structure light module, according to an embodiment of the present invention.

FIG. 5 schematically illustrates a structure light module 500, according to an embodiment of the present invention. It is appreciated that all drawings are not to scale. FIG. 5 is similar to FIG. 3, except wafer level FOE 402 replaces wafer level FOE 202 in structure light module 500.

Wafer level FOE 402 of FIG. 4 may be disposed directly or indirectly on first wafer level lens 114. Light emitted from VCSEL array 104 is reflected by first replicated free-form-shape 406 toward second replicated free-form-shape 408. Second replicated free-form-shape 408 further reflects light reflected by first replicated free-form-shape 406 toward second wafer level lens 124. Free-form-shapes 406 and 408 have curve reflecting surfaces.

First replicated free-form-shape 406 of FOE 402 may be aligned with first wafer level lens 114, and second replicated free-form-shape 408 of FOE 402 may be aligned with second wafer lens 124.

For example, a width of free-form-shape (FW) 502 of first replicated free-form-shape 406 and second replicated free-form-shape 408 is equal to or less than a module width (MW) 504 of structure light module 100. First replicated free-form-shape 406 and second replicated free-form-shape 408 reflect light based on total internal reflection. Alternatively, first replicated free-form-shape 406 and second replicated free-form-shape 408 are coated with reflecting layers, respectively.

Coherent light emitted from VCSEL array 104 illuminates DOE 128 in a same way as illustrated and explained in FIGS. 1 and 3. Accordingly, a structure light is projected from DOE 128 on a target surface for 3D imaging.

Figure 6:
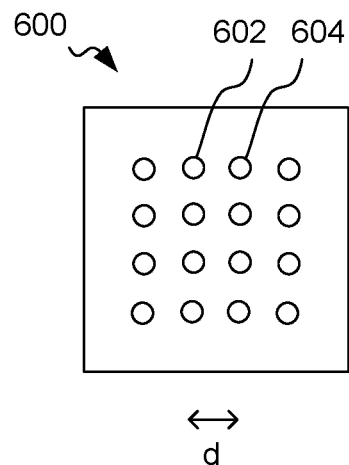
FIG. 6 schematically illustrates a VCSEL (vertical cavity surface emitting laser) array, according to an embodiment of the present invention.

FIG. 6 schematically illustrates a VCSEL array 600, according to an embodiment of the present invention. VCSEL array 600 comprises a plurality of individual VCSELs, including a first individual VCSEL 602 and an adjacent second individual VCSEL 604. For example, individual VCSELs are evenly arranged on a surface. For example, a distance between first individual VCSEL 602 and adjacent second individual VCSEL 604 is d.

Figure 7:
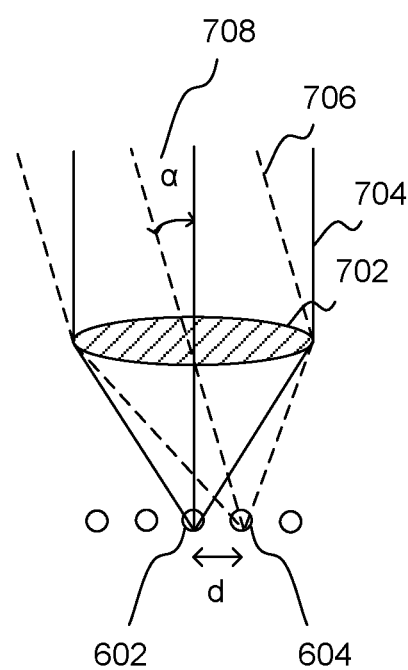
FIG. 7 schematically illustrates a lens collimating light emitted by two adjacent individual VCSELs, according to an embodiment of the present invention.

FIG. 7 schematically illustrates a lens 702 that effectively collimates light emitted by first individual VCSEL 602 and second individual VCSEL 604, according to an embodiment of the present invention. Lens 702 may be a combination of first wafer level lens 114 and second wafer level lens 124 of FIGS. 1, 3, and 5. First individual VCSEL 602 and second individual VCSEL 604 may be individual VCSELs included in VCSEL array 104 of FIGS. 1, 3, and 5. Light emitted from first individual VCSEL 602 is effectively collimated by lens 702 becoming a first collimated beam 704 (solid line). Light emitted from second individual VCSEL 604 is effectively collimated by lens 702 becoming a second collimated beam 706 (dashed line). First individual VCSEL 602 is adjacent to second individual VCSEL 604. An angle between first collimated beam 704 and second collimated beam 706 is α 708. Individual VCSELs are arranged periodically, thus the angle between successive collimated beams formed by lens 702 is α.

Figure 8:
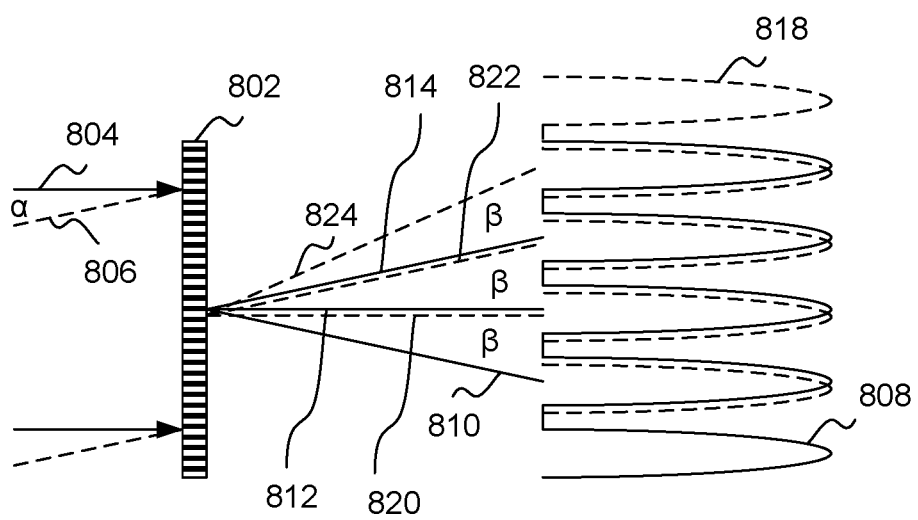
FIG. 8 schematically illustrates a DOE (diffractive optical element) illuminated by two adjacent collimated beams generating a far field diffraction pattern, according to an embodiment of the present invention.

FIG. 8 schematically illustrates a DOE 802 illuminated by a first collimated beam 804 (solid line) and a second collimated beam 806 (dashed line), according to an embodiment of the present invention. First collimated beam 804 may be first collimated beam 704 of FIG. 7. Second collimated beam 806 may be second collimated beam 706 of FIG. 7. A first far field diffraction pattern 808 (solid line) is generated by DOE 802 under illumination of first collimated beam 804. Far field diffraction pattern 808 may be a periodical pattern having multiple maxima. For example, the multiple maxima comprises a first maximum at a first angular position 810 (solid line), a second maximum at a second angular position 812 (solid line), a third maximum at a third angular position 814 (solid line), and so forth. First maximum 810 and second maximum 812 form an angle β, second maximum 812 and third maximum 814 form an angle β, and so forth. Successive maxima of the multiple maxima form an angle β (a first angle).

A second far field diffraction pattern 818 (dashed line) is generated by DOE 802 under illumination of second collimated beam 806. Second far field diffraction pattern 818 is identical to first far field diffraction pattern 808, which is a periodical pattern having multiple maxima. Second far field diffraction pattern 818 is shifted away from first far field diffraction pattern 808. For example, the multiple maxima comprises a first maximum at a first angular position 820 (dashed line), a second maximum at a second angular position 822 (dashed line), a third maximum at a third angular position 824 (dashed line), and so forth. First maximum 820 and second maximum 822 form an angle β, second maximum 822 and third maximum 824 form an angle β, and so forth. Successive maxima of the multiple maxima form an angle β (the first angle).

If first collimated beam 804 and second collimated beam 806 form an angle α (a second angle) similar to FIG. 7, and for α equals β (the second angle equals the first angle), first maximum 820 of second far field diffraction pattern 818 coincides with second maximum 812 of first far field diffraction pattern 808. Second maximum 822 of second far field diffraction pattern 818 coincides with third maximum 814 of first far field diffraction pattern 808, and so forth. In this manner, the superimposed far field diffraction patterns will be identical to a single far field diffraction patterns, for example, first far field diffraction pattern 808 alone. Because, each far field diffraction pattern coincides with another far field diffraction pattern.

In other words, the angle formed by two successive collimated beams α (the second angle) equals the angle β (the first angle) formed by two successive maxima of the multiple maxima of the far field diffraction pattern. In this manner, a single far field diffraction pattern may be generated. The generated single far field diffraction pattern is a periodical pattern that may comprise periodical lines or periodical dots. The generated far field diffraction pattern is the structure light for 3D imaging. The structure light may be projected on a target surface.

Figure 9:
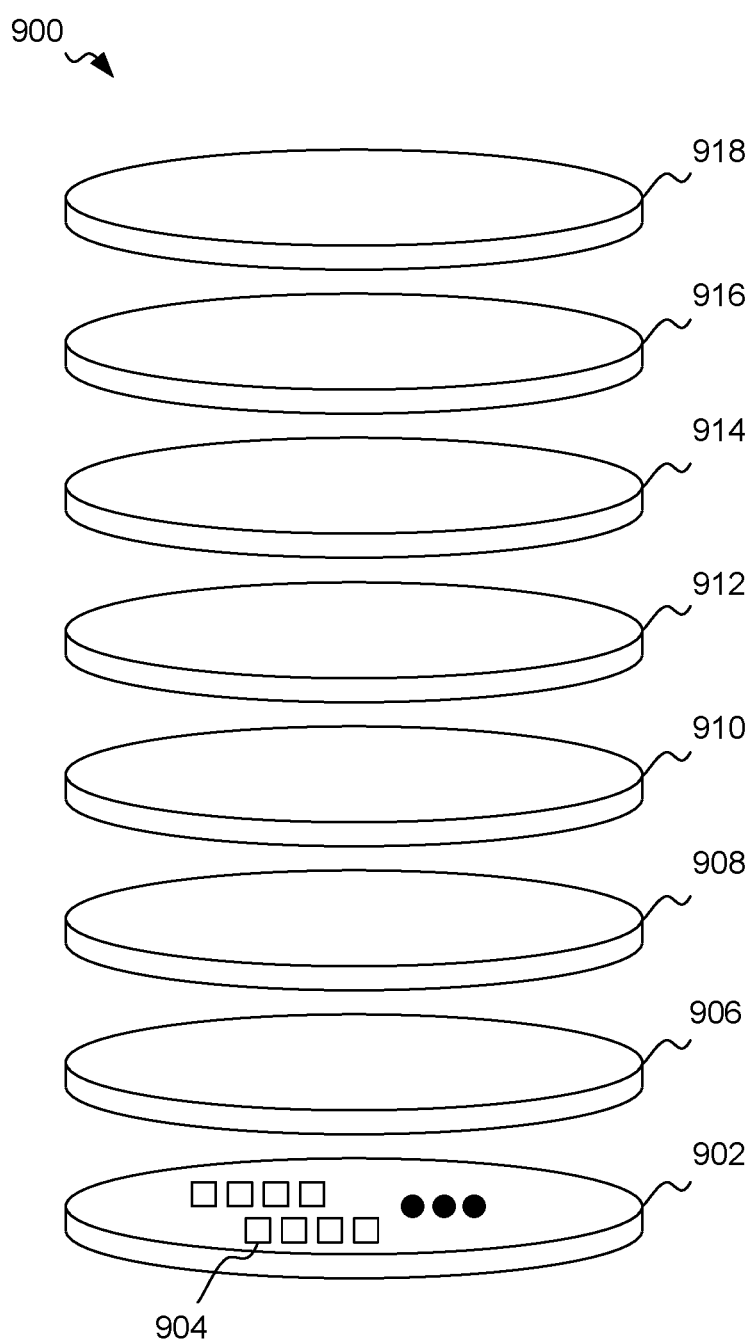
FIG. 9 schematically illustrates a method for fabricating structure light modules, according to an embodiment of the present invention.

FIG. 9 schematically illustrates a method 900 for fabricating structure light modules, according to an embodiment of the present invention. A VCSEL wafer 902 comprises a plurality of VCSEL arrays 904. A first spacer wafer 906 having a plurality of through holes (not shown) is disposed on VCSEL wafer 902. At least one through hole of the plurality of through holes is aligned with a VCSEL array of the plurality of VCSEL arrays 904. A first lens wafer 908 comprising a plurality of replicated lenses (not shown) on at least a first surface of lens wafer 908 is disposed on first spacer wafer 906. At least one replicated lens of the plurality of replicated lens is aligned with a VCSEL array of the plurality of VCSEL arrays 904.

A FOE wafer 910 comprising a plurality of pairs of replicated reflecting elements (not shown) on two sides of FOE wafer 910 is disposed on first lens wafer 908. At least a pair of replicated reflecting elements of the plurality of pairs of replicated reflecting elements is aligned with a VCSEL array of the plurality of VCSEL arrays 904. A second spacer wafer 912 having a plurality of through holes (not shown) is disposed on FOE wafer 910. At least one through hole of the plurality of through holes is aligned with a VCSEL array of the plurality of VCSEL arrays 904, after light emitted from the VCSEL array is reflected twice by FOE wafer 910. A second lens wafer 914 comprising a plurality of replicated lenses (not shown) on at least a first surface of second lens wafer 914 is disposed on second spacer wafer 912. At least one replicated lens of the plurality of replicated lenses is aligned with a VCSEL array of the plurality of VCSEL arrays 904, after light emitted from the VCSEL array is reflected twice by FOE wafer 910. A third spacer wafer 916 having a plurality of through holes (not shown) is disposed on second lens wafer 914. At least one through hole of the plurality of through holes is aligned with a VCSEL array of the plurality of VCSEL arrays 904, after light emitted from the VCSEL array is reflected twice by FOE wafer 910. A DOE wafer 918 comprising a plurality of DOEs (not shown) is disposed on third spacer wafer 916. At least one DOE of the plurality of DOEs is aligned with a VCSEL array of the plurality of VCSEL arrays 904, after light emitted from the VCSEL array is reflected twice by FOE wafer 910.

After all wafers are properly stacked and bonded, the stacked and bonded wafers are singulated to produce each structure light module 300 of FIG. 3 or structure light module 500 of FIG. 5. The stacked wafers comprise VCSEL wafer 902, first spacer wafer 906, first lens wafer 908, FOE wafer 910, second spacer wafer 912, second lens wafer 914, third spacer wafer 916, and DOE wafer 918. It is appreciated that VCSEL wafer 902 may be a silicon or semiconductor wafer while other wafers may not be silicon or semiconductor wafers.

The replicated reflecting elements of the FOE may be replicated prisms or replicated free-form-shapes having curve reflecting surfaces. FOE wafer 910 may be a prism wafer comprising replicated prisms on two sides of FOE wafer 910 or a free-form-shape wafer comprising replicated free-form-shapes on two sides of FOE wafer 910.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A structure light module comprising:
   a VCSEL (vertical cavity surface emitting laser) array comprising a plurality of individual VCSELs on a VCSEL substrate;
   a first wafer level lens comprising a first glass substrate and at least a first replicated lens on a first surface of the first glass substrate;
   a wafer level FOE (folding optical element) having a first replicated reflecting element and a second replicated reflecting element for folding light emitted from the VCSEL array, wherein the first replicated reflecting element is replicated on a first surface of a second glass substrate and the second replicated reflecting element is replicated on a second surface of the second glass substrate, wherein the second surface is opposite to the first surface, and the first surface and the second surface are parallel, and wherein a first part of the first surface of the second glass substrate opposite to the second replicated reflecting element is flat and uncovered by the first replicated reflecting element and a second part of the second surface of the second glass substrate opposite to the first replicated reflecting element is flat and uncovered by the second replicated reflecting element;
   a second wafer level lens comprising a third glass substrate and at least a replicated lens on a first surface of the third glass substrate;
   a DOE (diffractive optical element);
   wherein an input light emitted from the VCSEL coming to the FOE is reflected by the first replicated reflecting element toward the second replicated reflecting element, and the light reflected by the first replicated reflecting element is reflected by the second replicated reflecting element toward the second wafer level lens;
   a first spacer disposed on the VCSEL substrate, wherein the first wafer level lens is disposed on the first spacer; and a second spacer disposed on the first part of the first surface of the second glass substrate of the FOE, wherein the second wafer level lens is disposed on the second spacer.

2. The structure light module of claim 1, wherein the first and second replicated reflecting elements of the FOE reflect light based on total internal reflection.

3. The structure light module of claim 1, wherein the first and second replicated reflecting elements of the FOE have coated reflecting layers to reflect light.

4. The structure light module of claim 1, wherein the first and second replicated reflecting elements of the FOE are replicated prisms.

5. The structure light module of claim 1, wherein the first and second replicated reflecting elements of the FOE are replicated free-form-shapes having curved reflecting surfaces.

6. The structure light module of claim 1, further comprising:
    a third spacer disposed on the second wafer level lens, wherein the DOE is disposed on the third spacer.

7. The structure light module of claim 1, wherein the VCSEL substrate is a semiconductor wafer, and wherein the VCSEL array is formed in the VCSEL substrate.

8. The structure light module of claim 1, wherein the VCSEL array is cut from a semiconductor wafer and attached to the VCSEL substrate.

9. The structure light module of claim 1, Wherein a structure light is projected from the DOE on a target surface for 3D imaging.

10. The structure light module of claim 1, wherein the DOE generates a far field diffraction pattern comprising one of periodical lines and periodical dots.

11. The structure light module of claim 10, wherein the generated far field diffraction pattern is a periodical pattern having multiple maxima, successive maxima of the multiple maxima form a first angle, the first angle equals a second angle formed by two successive collimated beams generated from two adjacent individual VCSELs of the VCSEL array.

12. The structure light module of claim 1, wherein the DOE is one of a grating, a phase grating, a Dammann grating, and a group of grooves on a glass substrate.

13. The structure light module of claim 1, wherein the VCSEL array emits one of IR light and visible light.

14. The structure light module of claim 1, further comprising an imaging lens for imaging an intensity pattern generated by the DOE on a target surface for 3D imaging.

* * * * *